(12) United States Patent
Chen et al.

(10) Patent No.: US 12,720,900 B2
(45) Date of Patent: Aug. 25, 2026

(54) THROUGH-SUBSTRATE-VIA IN PHOTOSENSITIVE MODULE

(71) Applicant: SEMICONDUCTOR COMPONENTS INDUSTRIES, LLC, Scottsdale, AZ (US)

(72) Inventors: Ming-Yao Chen, Taipei City (TW); Chien-Wei Chang, Taipei (TW); Chih-Hung Tu, Taoyuan City (TW)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 358 days.

(21) Appl. No.: 18/350,445

(22) Filed: Jul. 11, 2023

(65) Prior Publication Data

US 2024/0021649 A1 Jan. 18, 2024

Related U.S. Application Data

(60) Provisional application No. 63/368,832, filed on Jul. 19, 2022, provisional application No. 63/368,745, filed on Jul. 18, 2022.

(51) Int. Cl.

| | |
|---|---|
| ***H10F 39/00*** | (2025.01) |
| ***H10P 50/24*** | (2026.01) |
| ***H10W 20/00*** | (2026.01) |
| ***H10W 70/05*** | (2026.01) |
| ***H10W 70/60*** | (2026.01) |

(Continued)

(52) U.S. Cl.

CPC ......... *H10F 39/811* (2025.01); *H10F 39/026* (2025.01); *H10P 50/242* (2026.01); *H10W 20/056* (2026.01); *H10W 20/076* (2026.01); *H10W 70/093* (2026.01); *H10W 74/014* (2026.01); *H10W 74/016* (2026.01); *H10W 70/05* (2026.01); *H10W 70/60* (2026.01); *H10W 70/65* (2026.01); *H10W 70/652* (2026.01); *H10W 70/66* (2026.01); *H10W 72/221* (2026.01); *H10W 72/90* (2026.01); *H10W 72/923* (2026.01); *H10W 72/952* (2026.01); *H10W 90/734* (2026.01)

(58) Field of Classification Search

CPC ........................... H10F 39/811; H01L 21/3065

See application file for complete search history.

(56) References Cited

U.S. PATENT DOCUMENTS 8,692,358 B2 * 4/2014 Huang ................. H10F 39/804 257/621

10,109,559 B2 10/2018 Lin et al.

(Continued)

FOREIGN PATENT DOCUMENTS

JP 2017130660 A 7/2017

*Primary Examiner* — William A Harriston

(74) *Attorney, Agent, or Firm* — Brake Hughes Bellermann LLP

(57) ABSTRACT

A package includes an optical sensor die. The optical sensor die has an optically active surface area (OASA) disposed on a front side of a substrate. A glass cover is disposed above the OASA and attached to the front side the substrate by a dam material. A through-substrate via (TSV) extends from an opening at a back side of the substrate toward a front side of the substrate. The TSV has a stepped bottom surface at the front side of the substrate. The TSV provides access for electrical connections between the back side of the substrate and the front side of the substrate.

22 Claims, 8 Drawing Sheets

(51) Int. Cl.

| | |
|---|---|
| ***H10W 70/65*** | (2026.01) |
| ***H10W 70/652*** | (2026.01) |
| ***H10W 70/66*** | (2026.01) |
| ***H10W 72/20*** | (2026.01) |
| ***H10W 72/90*** | (2026.01) |
| ***H10W 74/01*** | (2026.01) |
| ***H10W 90/00*** | (2026.01) |

(56) References Cited

U.S. PATENT DOCUMENTS

| | | | | |
|---|---|---|---|---|
| 2012/0049307 | A1 | 3/2012 | Huang et al. | |
| 2012/0205799 | A1 | 8/2012 | Lin | |
| 2014/0252647 | A1 | 9/2014 | Huang et al. | |
| 2016/0099195 | A1 | 4/2016 | Huang | |
| 2016/0190353 | A1* | 6/2016 | Liao | H10F 39/018<br>257/432 |
| 2016/0218129 | A1* | 7/2016 | Liu | H10F 39/804 |
| 2016/0233260 | A1 | 8/2016 | Yiu et al. | |
| 2016/0254312 | A1 | 9/2016 | Lee et al. | |
| 2016/0315043 | A1 | 10/2016 | Ho et al. | |
| 2017/0077158 | A1 | 3/2017 | Huang et al. | |
| 2017/0249493 | A1 | 8/2017 | Yu et al. | |
| 2018/0012853 | A1 | 1/2018 | Lin et al. | |
| 2018/0151389 | A1 | 5/2018 | Kuo et al. | |
| 2018/0301434 | A1 | 10/2018 | Wang et al. | |
| 2021/0035940 | A1 | 2/2021 | Lai et al. | |
| 2021/0082841 | A1 | 3/2021 | Lee et al. | |
| 2021/0210445 | A1 | 7/2021 | Cheng et al. | |
| 2023/0081775 | A1 | 3/2023 | Chen et al. | |
| 2023/0197688 | A1 | 6/2023 | Chen et al. | |

* cited by examiner 340
330
320
150
12
116
FS
114C
10
114
112
BS
340
320
330
340
130b
10
340
SW
C
114C
312
12
t
110
310
X
Z
300

THROUGH-SUBSTRATE-VIA IN PHOTOSENSITIVE MODULE

RELATED APPLICATION

This application claims priority to U.S. Provisional No. 63/368,745 filed on Jul. 18, 2023 and claims priority to U.S. Provisional No. 63/368,832 filed on Jul. 19, 2023, both of which are incorporated by reference in their entireties herein.

This application is also related to commonly assigned U.S. patent Application Ser. No. 18/350,474, titled "PACKAGING STRUCTURE AND METHOD OF A PHOTOSENSITIVE MODULE," filed on Jul. 11, 2023, which is incorporated by reference in its entirety herein.

TECHNICAL FIELD

This description relates to a semiconductor device module that includes an optical sensor.

BACKGROUND

Digital optical sensors (e.g., a complementary metal-oxide-semiconductor image sensor (CIS) or a charge-coupled device (CCD)) are typically packaged in an integrated circuit (IC) package (i.e., a ceramic ball grid array package (CBGA) or a plastic ball grid array (PB GA) package along with a glass cover or lid placed over the optical sensor die. Newer applications (e.g., automotive applications such as advanced driver assistance systems (ADAS) and autonomous driving (AD) systems) need other circuitry (e.g., image signal processor (ISP) or ASIC die) to be included in the same IC package as the CIS die for improved imaging performance. The other circuitry (e.g., image signal processor (ISP) or ASIC die) can be placed underneath the image sensor die, which has the glass cover or lid placed over it.

SUMMARY

In a general aspect, a semiconductor die includes a substrate including a semiconductor device. A through-substrate via (TSV) extends from an opening at a back side of the substrate toward a front side of the substrate. The TSV has a stepped bottom surface at the front side of the substrate. The stepped bottom surface includes a central portion exposing a metal contact pad and a step portion (e.g., a circumferential or surrounding step portion) extending away from edges of the central portion. The step portion (circumferential step portion) includes an interlayer dielectric.

In a general aspect, a package includes an optical sensor die. The optical sensor die has an optically active surface area (OASA) disposed on a front side of a substrate. A glass cover is disposed above the OASA and attached to the front side the substrate by a dam material. A through-substrate via (TSV) extends from an opening at a back side of the substrate toward a front side of the substrate. The TSV has a stepped bottom surface at the front side of the substrate. The TSV provides access for electrical connections between the back side of the substrate and the front side of the substrate.

In a general aspect, a method include etching a trench through a semiconductor substrate from a back side of the semiconductor substrate. The trench extends from the back side of the semiconductor substrate to a front side of the semiconductor substrate. The method further includes etching, through the trench, an opening in a first inter dielectric layer (IDL) disposed on the front side of the semiconductor substrate. The opening exposes a portion of a contact pad included in a second IDL disposed over the first IDL and forming a central portion of a bottom surface of the trench. The method further includes etching, through the trench, the semiconductor material overlying an unetched portion of the first IDL along a perimeter of the opening to form a raised step portion of the bottom surface of the trench.

Figure 1:
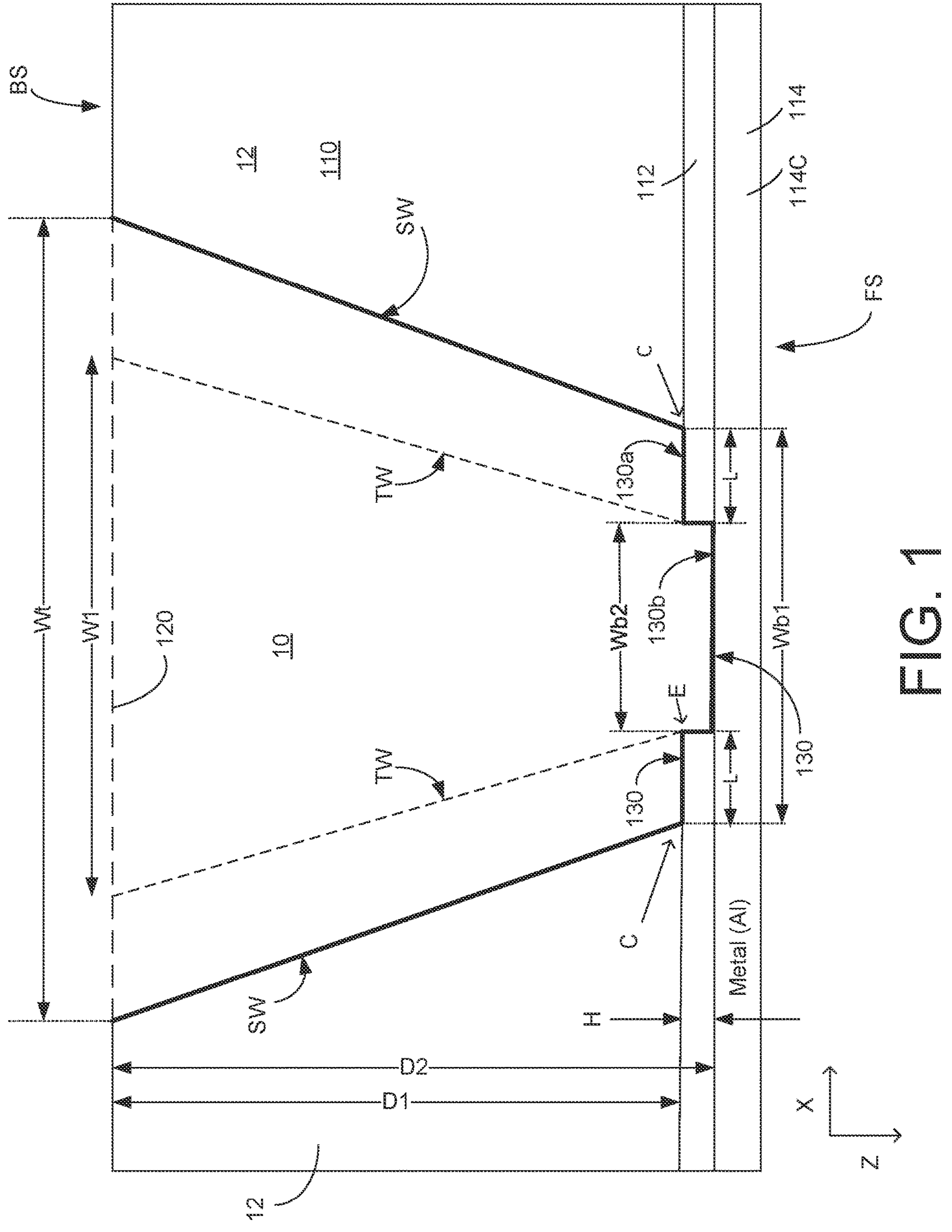
FIG. 1 is a cross-sectional view of a though substrate via, according to an implementation of the present disclosure.

Aspects of the present disclosure are best understood from the following detailed description when read with reference to the accompanying drawings. It is noted that, in accordance with common practice in the industry, various features are not necessarily drawn to scale. The relative dimensions of the various features may be increased or decreased for clarity or ease in visualization. In the drawings, like reference symbols may indicate like and/or similar components (elements, structures, etc.) in different views. The drawings illustrate generally, by way of example, but not by way of limitation, various implementations discussed in the present disclosure. Reference symbols shown in one drawing may not be repeated for the same, and/or similar, elements in related views. Reference symbols that are repeated in multiple drawings may not be specifically discussed with respect to each of those drawings but are provided for context between related views. Also, not all like elements in the drawings are specifically referenced with a reference symbol when multiple instances of an element are illustrated.

DETAILED DESCRIPTION

An optical sensor (e.g., a complementary metal-oxide semiconductor (CMOS) pixel sensor) fabricated on a semiconductor device die (semiconductor die) (e.g., optical sensor die) includes an optically active surface area (OASA) with an array of pixel sensors (e.g., a x-y array of pixels) responsible for converting a light and color spectrum into electrical signals. Each pixel sensor in the array of pixels may, for example, include a photo diode or a photo transistor that senses and converts incident light into an electrical signal. The OASA of an optical sensor may also include, for example, a micro lens array (e.g., a x-y array of micro lenses) to help funnel incoming light into each pixel (thereby increasing the sensitivity of the optical sensor) and or include a color filter array (CFA) (e.g., a x-y array of filters) (i.e., a mosaic of tiny color filters coupled to the pixel sensors to capture color information).

An optically transparent cover (also can be referred to as a glass cover or lid) overlays the optical sensor die in many optical sensor package configurations. The cover glass may be attached to the semiconductor die, for example, by a bead of adhesive material (e.g., an epoxy or a resin) disposed on edges of the semiconductor die. The cover glass provides a hard cleanable surface as the top surface of the sensor the optical sensor die and can physically shield the delicate optical sensor surface (e.g., the optically active surface area) from physical damage (caused, e.g., by dirt, dust, fingerprints, grease, smudges, etc.). The cover glass itself can provide a hard cleanable surface as the top surface of the packaged optical sensor die.

In example implementations, the glass cover is positioned above the optical sensor surface with a gap (e.g., an air gap or other transparent material-filled gap) interposed between a bottom surface of the glass cover and the optically active surface area (OASA) (i.e., the area above the sensor pixels, and including the CFA and micro lens layers). A dam material (e.g., an epoxy or resin) may hold the glass cover in place above the optical sensor surface.

This disclosure describes packaging of individual optical sensor dies in individual chip-scale packages (CSPs) (i.e., individual photosensitive modules), and methods for batch fabrication of the individual photosensitive modules using wafer level processing steps. After completion of the wafer-level processing steps, the wafer on which the individual image sensor dies are fabricated may be singulated (scribed or diced) to separate the individual chip-scale packages (CSPs).

The side of the optical sensor die on which the OASA is disposed (and over which the cover glass is placed) may be referred to as the front side (or front surface FS) of the optical sensor die, and the opposite side (opposite the side with the OASA or the glass cover) may be referred to as the back side (or back surface BS) of the optical sensor die.

A passivation layer (e.g., silicon oxide or nitride, or other dielectric) may be disposed on the back surface (BS) of an optical sensor die in a photosensitive module. Further, a redistribution layer (RDL) (e.g., a signal redistribution layer) may be disposed on or in the passivation layer. The RDL may be made of insulating material, for example, a dam material (e.g., an epoxy or resin) and may, for example, include conductive traces or pads (e.g., metal contact pads) of a back side metallization layer of the optical sensor die.

A through-substrate-via (TSV) may be etched (e.g., vertically) through an optical sensor die to provide access for electrical connections between the back side (e.g., the back surface BS) of the die and the front side (e.g., front surface FS) of optical sensor die. The TSV may, for example, provide a physical access path for an electrical connection to a contact pad (disposed, e.g., next to the OASA) at the front side (e.g., top surface FS) of the optical sensor die from the back side (e.g., back surface BS) of the die. The electrical connection may, for example, include a conductive material trace or line formed on sidewalls of the TSV.

A diameter (or width) of an opening of the TSV adjacent to the back surface BS of optical sensor die can be generally greater than the diameter (or width) of an opening of the TSV adjacent to the front surface of the optical sensor die. As a result, the TSV can have inclined sidewalls that are generally sloping inward from the opening of the TSV adjacent to the back surface BS of optical sensor die toward a bottom of the TSV adjacent to the front surface FS of optical sensor die.

A conductive material (e.g., a metal such as nickel (Ni)) may be patterned in the TSV (e.g., disposed on sides of the TSV) to form a redistribution layer RDL, which can provide electrical connections to the front side (e.g., front surface FS) of optical sensor die from the back side (e.g., back surface BS) of optical sensor die. The conductive material (e.g., metal) disposed on sidewalls of the TSV may connect, for example, a contact pad at the front side (e.g., at about the front surface FS) of optical sensor die to the traces or contact pads in the RDL disposed on the back side (e.g., bottom surface BS) of optical sensor die.

In some example implementations, the patterned conductive material disposed in the TSV may include aluminum, copper, gold, platinum, nickel, tin, a combination thereof, a conductive polymer material, a conductive ceramic material (such as indium tin oxide or indium zinc oxide), or another suitable conductive material. The conductive material may be disposed on sidewalls of the TSV, for example, by a metal deposition process (e.g., sputtering, chemical vapor deposition (CVD), or metal plating process, etc.)

In accordance with the principles of the present disclosure, a vertical through-semiconductor-via (TSV) for making an electrical connection to a contact pad on a front side of an optical sensor die from the back surface of the optical sensor die has a stepped bottom surface adjacent to the front surface of the optical sensor die. The TSV may, for example, a larger depth on a central portion of the bottom surface, and a smaller depth on a step portion of its bottom surface extending outwardly from edges of the central portion.

FIG. 1 schematically illustrates a cross-sectional profile of an example TSV 10 with a stepped bottom surface in a portion of an optical sensor die 12. The optical sensor die may be formed in a semiconductor substrate (e.g., semiconductor substrate 110) and may include an optically active sensor area (OASA) (not shown) formed on a surface of the substrate. For visual clarity and in consideration of fitting the size and scale of the figure on the page, FIG. 1 shows only a portion of the optical sensor die that excludes the portion including the OASA.

As shown in FIG. 1, TSV 10 may be etched vertically (e.g., in a z direction) in semiconductor substrate 110 between a back side BS and a front side FS of the substrate. A dielectric layer (e.g., IDL 112, oxide layer) and an RDL layer (e.g., IDL 114 including metal contact pad 114C) may be included in the front side FS of substrate 110. TSV 10 may include inclined sidewalls SW that are sloping inward from an opening 120 at back side BS of the substrate toward a stepped bottom surface 130 at the front side FS of the substrate. In example implementations, opening 120 may have a width (or diameter) Wt and stepped bottom surface 130 may have a width Wb1 (e.g., in the x direction). In example implementations, stepped bottom surface 130 may include an inner bottom surface portion (e.g., surface well portion 130*b*) and a raised step or ledge portion (e.g., ledge portion 130*a*). The raised step or ledge portion 130*a* extends away from the edges of surface well portion 130*b*. In a top plan view, the raised step or ledge portion 130*a* extends away from the edges along a perimeter or circumference of surface well portion 130*b*. In other words, the raised step or ledge portion surrounds or circumferentially surrounds the surface well portion.

In example implementations, surface well portion 130*b* may have a width Wb2 and ledge portion 130*a* may have a width L (e.g., such that stepped bottom surface width, Wb1=Wb2+2*L). In example implementations, the raised ledge portion 130*a* may be offset in the z direction above inner bottom portion or surface well portion 130*b* by a distance H. In other words, the raised ledge portion 130*a* may form a staircase-like step of height H above inner bottom portion or surface well portion 130*b*. The raised ledge portion 130*a* may be at vertical depth D1 (in the z direction) below opening 120 and inner bottom portion or surface well portion 130*b* may be at vertical depth D2 below opening 120 at back side BS, with D2=D1+H.

In example implementations, surface well portion 130*b* may extend through (e.g., be etched through) the dielectric layer (e.g., IDL 112, oxide layer) to expose the RDL (e.g., IDL 114 including metal contact pad 114C) to TSV 10. The exposed portions of metal contact pad 114C can be contacted through TSV 10 by conductive materials (e.g., nickel (Ni)) (not shown) deposited in TSV 10.

In example implementations, the raised ledge portion 130*a* of the bottom surface of TSV 10 may be formed by unetched portions of the dielectric layer (e.g., IDL 112, oxide layer). The raised ledge portion 130*a* (of length L and height H) can present a barrier to outward penetration into the body of the semiconductor die 12 of conductive materials (e.g., metals) (not shown) deposited in TSV 10. Without the raised ledge portion 130*a*, metals (e.g., Ni) deposited in TSV 10 may, for example, penetrate from corner regions C of the TSV into the body of the semiconductor die 12 (e.g., into semiconductor substrate 110), for example, along the interfaces of the dielectric layer (e.g., IDL 112, oxide layer). The raised ledge portion 130*a* effectively reinforces the corner regions C of the TSV to present the barrier to penetration of metals from the corner regions C of the TSV into the body of semiconductor die 12.

During a stage in the fabrication of TSV 10, after surface well portion 130*b* is etched in the oxide layer (e.g., IDL 112), a sidewall (e.g., temporary sidewall TW) of TSV 10 may extend from backside BS of the substrate to an edge (e.g., edge E) of surface well portion 130*b*. At this stage of fabrication, opening 120 of the TSV may have a width (or diameter) W1 that is less than the width Wt at the completion of the fabrication. The raised ledge portion 130*a* formed by the unetched portions of the dielectric layer (e.g., IDL 112, oxide layer, may still be covered by silicon material of the substrate. Further, etching (silicon etching) may be performed to remove overlying silicon material to expose IDL 112 (of length L) to form the raised ledge portion 130*a* of stepped bottom surface 130 of TSV 10.

An example photosensitive module (e.g., an optical sensor package) may include optical sensor die with a stepped-bottom TSV (e.g., like TSV 10) for making electrical connection from a back side of the optical sensor die to a front side of the optical sensor die. Wafer-level processing steps may be used for fabricating the example photosensitive module including the optical sensor die with the stepped-bottom TSV from a semiconductor substrate on which the OASA are formed. The OASA may be formed on a front surface of the semiconductor substrate. A plurality of passivating dielectric layers (interlayer dielectric (ILD)) also may be disposed on the front surface of the semiconductor substrate surrounding or adjacent to the OASA on the front surface of the semiconductor substrate. These IDLs may include elements (e.g., a metal contact pad) of a redistribution layer disposed on the front side of the optical sensor die. The metal contact pad may be disposed, for example, in a second IDL that is disposed between a first IDL and a third IDL (e.g., in a second IDL disposed underneath the first IDL).

Figure 2:
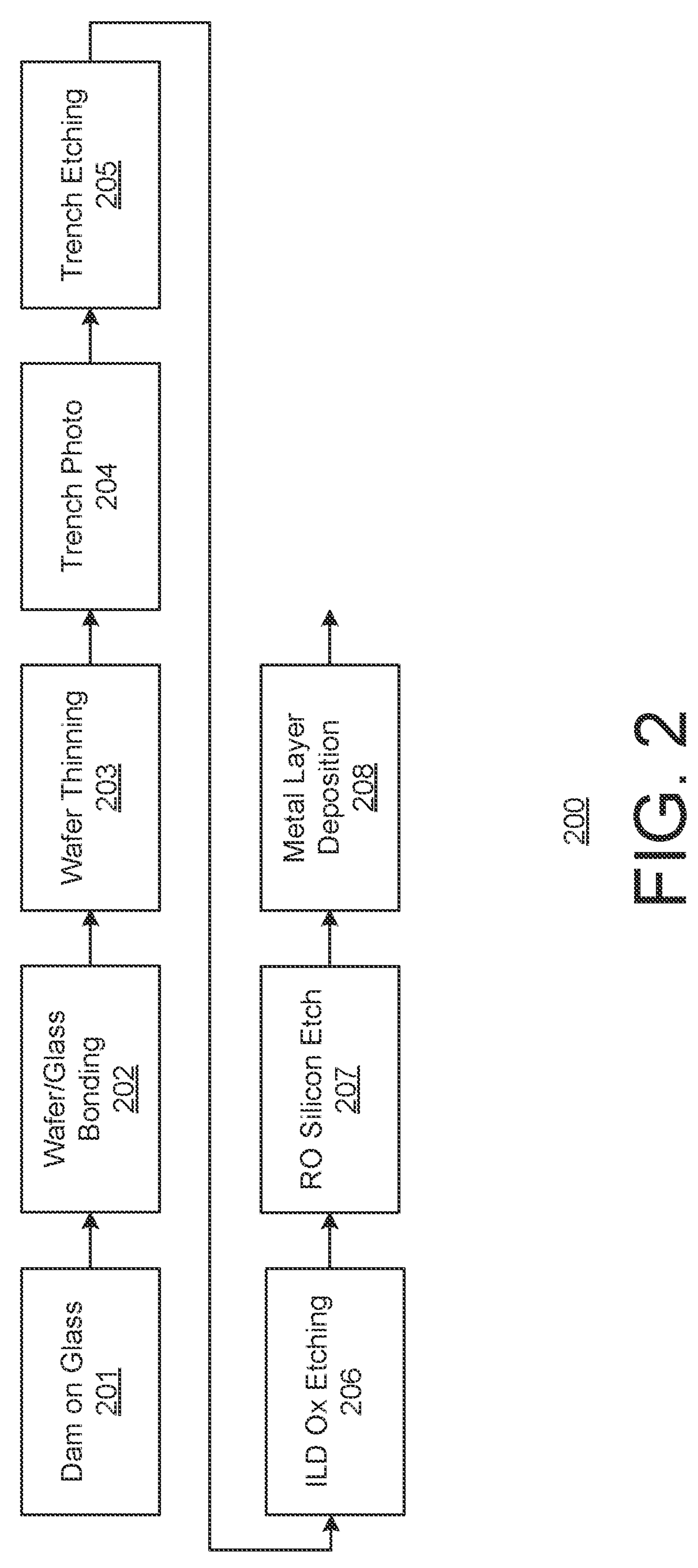
FIG. 2 is a flow chart illustrating some example steps of an example process for fabricating a photosensitive module, according to an implementation of the present disclosure.

FIG. 2 is a flow chart illustrating some example steps of an example process 200 for fabricating a photosensitive module. Process 200 may include steps for making electrical connections between a front side and a back side of an optical sensor die in the photosensitive module (optical sensor package). The electrical connections may be made using a stepped-bottom TSV (e.g., TSV 10) for physical access between the front side and the back side of the optical sensor die.

In process 200, a step 201: Dam on Glass, may include disposing dam material (e.g., an epoxy of adhesive material) on a glass cover, and a step 202: Wafer to Glass Bonding, may include placing the glass cover above the OASA on the semiconductor substrate and bonding the glass cover to the semiconductor substrate using the dam material. Further, in process 200, a step 203: Wafer Thinning, may include back side thinning (e.g., back side grinding or etching) of the semiconductor substrate (e.g., a silicon substrate) to a target thickness (e.g., a thickness of about 75 μm to 150 μm).

Next, a step 204: Trench Photo, may include forming a lithographically patterned masking layer (e.g., a solder mask layer, a polymer) on a back surface of the thinned semiconductor substrate. Openings in the solder mask layer on the back surface of the semiconductor substrate may be aligned with the RDL elements (e.g., a metal contact pad) included in the ILD layers disposed on the front side of the optical sensor die. The metal contact pad may, for example, be included in the second IDL disposed between the first IDL and the third IDL layer disposed on the front side of the optical sensor die.

In example implementations, the solder mask layer on the back surface of the semiconductor substrate may also include openings aligned with die perimeter lines (e.g., scribe lines) that can be used for singulating or dicing individual optical sensor die from the semiconductor substrate into individual photosensitive modules (e.g., at the end of process 200).

Further in process 200, a step 205: Trench Etching, may include etching trenches (TSVs) in the silicon substrate through the openings in the solder mask layer. At step 205, the trench etching may be carried out using one or more etchants (dry etchants) to etch through the silicon material and also to remove the remaining solder mask material. The etchants may etch through the silicon material of the substrate and stop at the dielectric materials of IDL layers. Internal sidewalls of the trench may extend from a top portion of the trench up to the first IDL.

A trench formed at this step may extend vertically from the back surface of semiconductor substrate up to the first of the IDLs disposed on the front surface of the semiconductor substrate. The first IDL may cover the metal contact pad included in the second IDL disposed on the front surface of the semiconductor substrate. The trench (e.g., TSV 10) formed through an opening aligned with the metal contact pad may have a bottom opening with a width W (e.g., width Wb1) at the first IDL.

In accordance with the principles of the present disclosure, process 200 may further include a step 206: ILD Etch, followed by a step 207: Re-oxide (RO) Silicon Etch.

At step 206, the ILD etch may include etching through the first ILD layer at the through the bottom opening (with a width Wb1 at the first IDL) of the TSV using a selective dielectric etchant. The removal of the IDL at the bottom of the trench may form a well portion of a bottom surface of the trench (e.g., surface well portion 130*b* with a width Wb2, FIG. 1). At this stage, a sidewall (e.g., temporary sidewall TW) of the TSV may extend from the back side of the substrate up to an edge (e.g., edge E) of surface well portion 130*b*.

The next step 207 in process 200 may involve further silicon etching to remove overlying silicon material (overlying the unetched portions of the first IDL) to expose a portion of IDL 112 (of length L) to form the raised ledge portion 130*a* of stepped bottom surface 130 of TSV 10.

Further, process 200 may include step 208: Metal Layer Deposition, which may include depositing a layer of metals in the TSV (e.g., on the sidewalls, and on the stepped bottom surface of the TSV). The metals (e.g., aluminum, copper, nickel, etc.) deposited in the sidewalls of TSV may form a conductive material trace or line on the sidewalls of the TSV that electrically connects the back side of the optical sensor die and the front side of the optical sensor die (i.e., connects to the contact pad in IDL on the front side). The metals (e.g., aluminum (Al), copper (Cu), nickel (Ni)) may be deposited by a chemical vapor deposition (CVD) and or sputtering processes.

Depositing the layer of metals in the TSV to form the conductive material trace or line on the sidewalls of the TSV (e.g., TSV 10) may include, before actual metal deposition, depositing an oxide layer to passivate the exposed surfaces of the silicon substrate (e.g., sidewalls SW of TSV 10, and back side surfaces of the silicon substrate), sputtering a seed layer (e.g., Ni) on the sidewalls, and patterning and etching the seed layer to define a redistribution layer between the back side and the front side of the optical sensor die.

Process 200 for fabricating the photosensitive module may further include additional wafer level processing steps for developing the redistribution layer on the back side of the silicon substrate before dicing or singulation of the silicon substrate into individual photosensitive modules. These additional wafer-level processing steps may, for example, include photolithography to form contact pads on the back side, attachment of lead frames, attachment of a ball grid array to the backside, and at least partial encapsulation of the optical sensor die in molding material, etc. For brevity, these additional wafer level processing steps are not described in detail herein. FIGS. 3A through 3F illustrate cross-sectional views of a photosensitive module at different stages of construction.

Figure 3A:
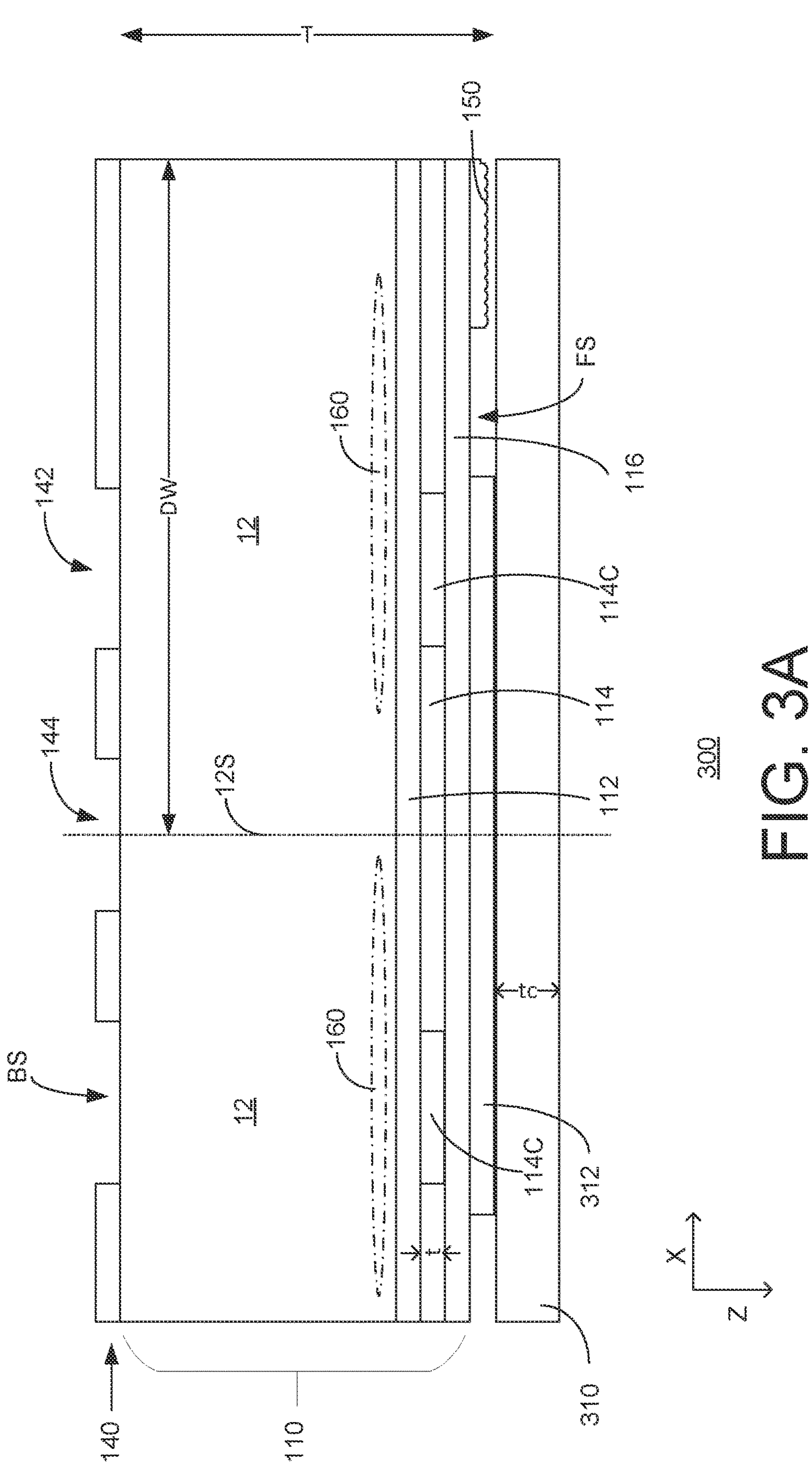
FIGS. 3A through 3E illustrate cross-sectional views of a photosensitive module at different stages of construction.

FIG. 3A shows, for example, an assembly 300 of a glass cover 310 and a semiconductor substrate 110 at an initial stage of construction. In assembly 300, semiconductor substrate 110 may, for example, be a semiconductor wafer (e.g., a 200 mm diameter silicon wafer). Semiconductor devices 160 may be fabricated in or on the substrate (e.g., about a front side FS of the substrate). Semiconductor substrate 110 may be thinned (e.g., by back side griding or etching) to a thickness Tin a range of about 50 μm to 150 μm (e.g., 85 μm). Semiconductor substrate 110 may include material for several semiconductor die 12 that can be individually singulated (or diced) from the substrate, for example, along die perimeter lines (e.g., scribe lines 12S). Each semiconductor die 12 may have a width DW (e.g., in the x direction) in a range of about 100 μm to 250 μm (e.g., 135 μm). In example implementations, semiconductor die 12 may be an optical sensor die that includes an optically active surface area (OASA) (e.g., OASA 150). The OASA may be formed on the front side (front surface) of the semiconductor substrate.

In assembly 300, glass cover 310 may be disposed above OASA 150 and attached (bonded) to semiconductor substrate 110 by a layer of dam material (e.g., dam 312). In example implementations, glass cover 310 may have a thickness tc in a range of about 200 μm to 900 μm (e.g., 400 μm).

A plurality of passivating dielectric layers (inter dielectric layers (IDL) 112, 114, and 116) also may be disposed on the front surface of the semiconductor substrate. Each of the IDL may have a thickness tin a range of about 0.4 μm to 2 μm (e.g., 0.6 μm). These IDLs, in addition to passivating exposed silicon and metal surfaces, may include elements (e.g., metal contact pad 114C) of a redistribution layer disposed on the front side of semiconductor die 12 for conveying electrical signals to and from semiconductor devices 160 in semiconductor die 12. Metal contact pad 114C may, for example, be included in IDL 114 that is disposed between IDL 112 and IDL 116. In example implementations, metal contact pad 114C may be made of metal (e.g., aluminum, copper, etc.) or other conductive material.

As shown in FIG. 3A, in assembly 300, a patterned masking layer (e.g., a solder mask layer 140) may be disposed on the back side (back surface BS) of semiconductor substrate 110. Some openings (e.g., opening 142) in solder mask layer 140 may be aligned with contact pads (e.g., metal contact pad 114C) on the front side of the substrate. Further, other openings (e.g., opening 144) on the back surface of the thinned semiconductor substrate may be aligned with the die perimeter lines (e.g., scribe lines 12S) that can be used for singulating or dicing individual semiconductor die 12 from the semiconductor substrate.

Figure 3B:
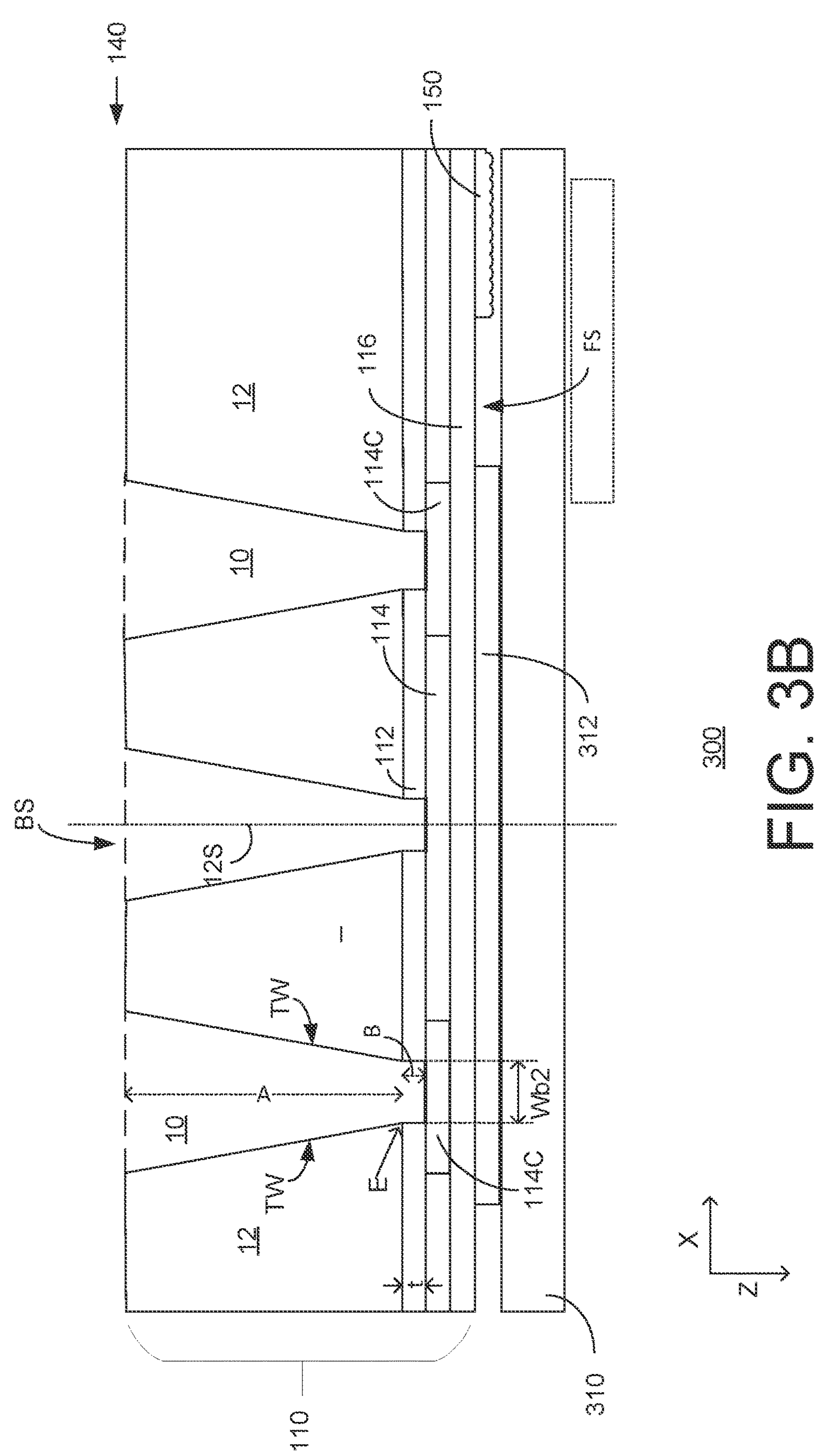

FIG. 3B shows, for example, assembly 300 after a next stage of construction (e.g., after step 205 and step 206, process 200) with through silicon vias (TSVs) etched through the openings (openings 142, opening 144) in solder mask layer 140 (FIG. 3A). The TSVs (e.g., TSV 10) through openings 142 may be aligned with the contact pads (metal contact pad 114C) on the front side of the substrate. A TSV 10, at this stage of construction, may include a portion A (formed by silicon etching) extending from the back surface of silicon substrate up to the first IDL layer (e.g., IDL 112) and a further portion B (e.g., a well portion) formed by etching through the first IDL layer (e.g., IDL 112) up to metal contact pad 114C in the second IDL layer (e.g., IDL 114). The well portion B may have a width Wb2 (FIG. 1). A (temporary) sidewall TW of TSV 10 may extend from back side BS of the substrate to an edge (e.g., edge E) of well portion B.

Figure 3C:
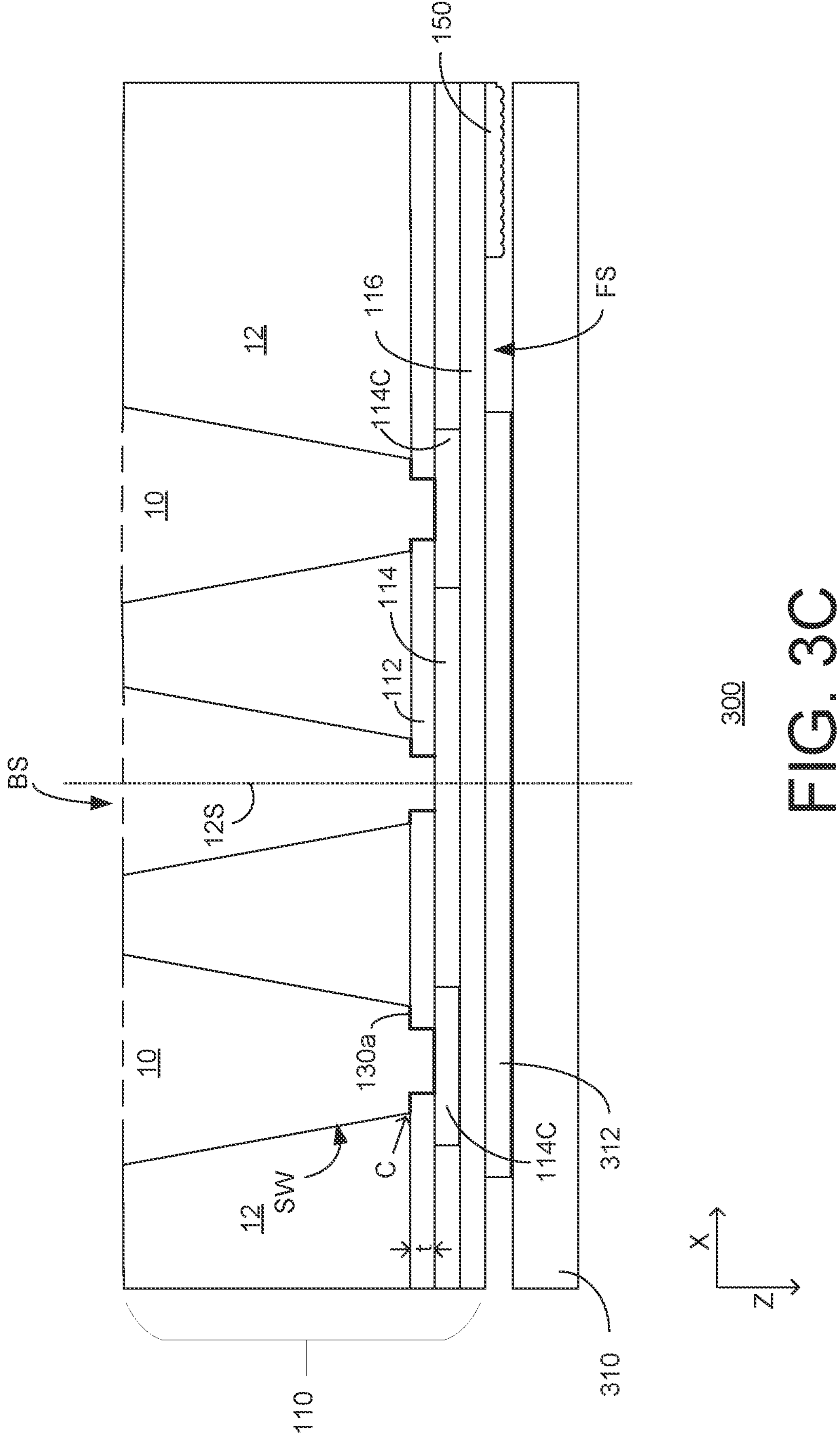

FIG. 3C shows, for example, assembly 300 after a further stage of construction (e.g., after step 207, process 200) with additional silicon etching of the silicon substrate to widen the TSV bottoms. This additional silicon etching, which stops at the first IDL (e.g., IDL 112), may expose an unetched portion of the first IDL layer (e.g., IDL 112) to form the raised ledge portion 130*a* of the bottom surface of TSV 10. Sidewalls SW of TSV 10 now extend from the back side BS of the substrate to an edge (e.g., corner C) of the raised ledge portion 130*a* of the bottom surface of TSV 10.

Further processing of assembly 300 may, as noted previously, involve deposition of a layer of metals in the TSV (e.g., on the sidewalls of the TSV, on the stepped bottom surface of the TSV, and on the back side of semiconductor die 12). The metals (e.g., aluminum, copper, nickel, etc.) deposited in the TSV may form a conductive material trace or line on the sidewalls of the TSV that electrically connects the back side and the front side of semiconductor die 12 (i.e., connects the back side to metal contact pad 114C on the front side). The metals (e.g., aluminum (Al), copper (Cu), nickel (Ni), etc.) may be deposited by chemical vapor deposition (CVD) and or sputtering processes.

Depositing the layer of metals in the TSV to form the conductive material trace or line on the sidewalls of the TSV (e.g., TSV 10) may include, before actual metal deposition, depositing an oxide layer to passivate the exposed surfaces of the silicon substrate (e.g., sidewalls SW of TSV 10, and on back side surfaces of the silicon substrate), sputtering a seed layer (e.g., Ni) on the sidewalls and on back side surfaces of the silicon substrate, and patterning and etching the seed layer to define a redistribution layer on the back side of sensor die. The redistribution layer may include, for example, a conductive material trace or line on the sidewalls of the TSV that electrically connects the front side of semiconductor die 12 (e.g., metal contact pad 114C) to a contact pad on the back side.

Figure 3D:
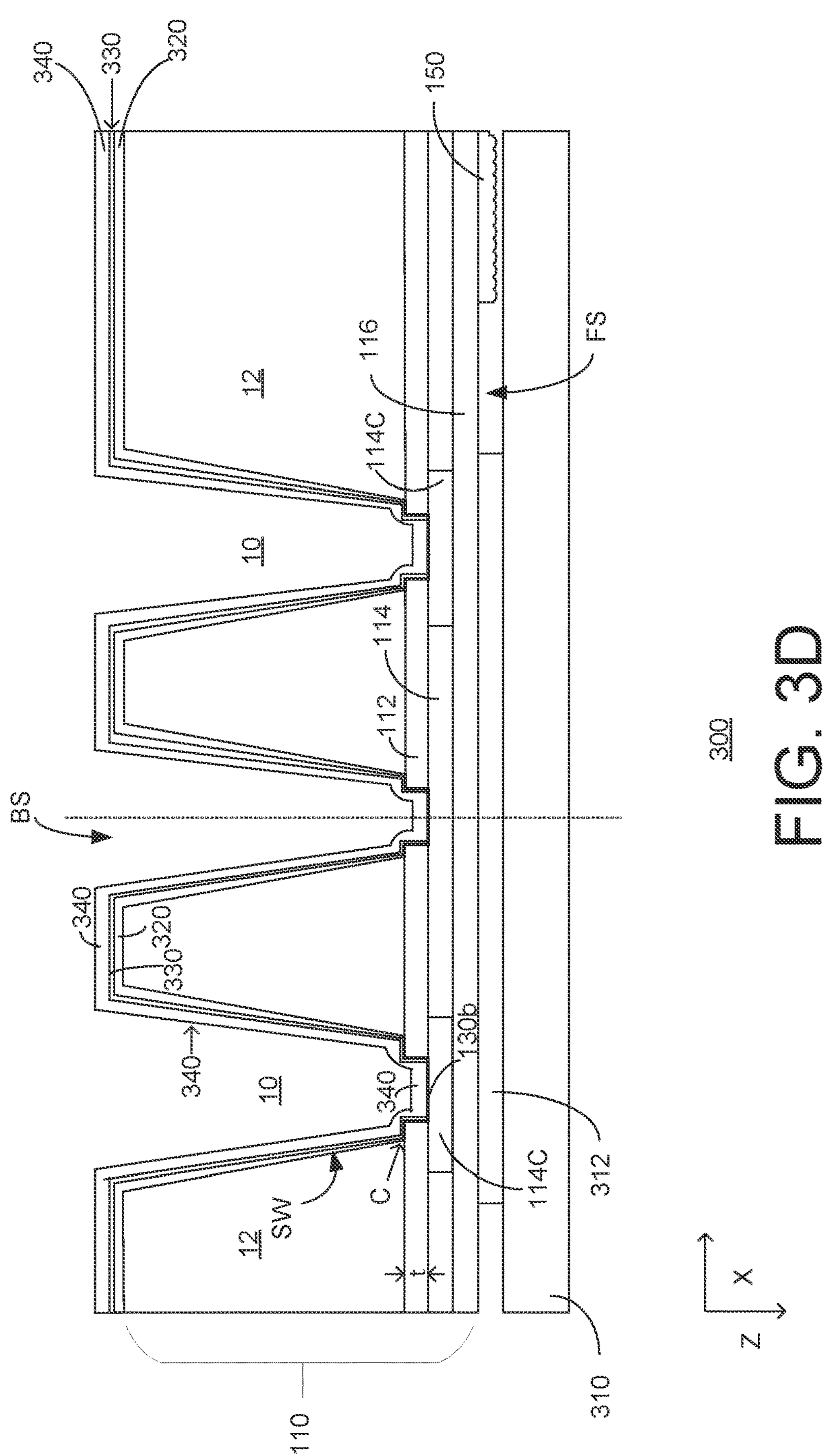

FIG. 3D, shows, for example, assembly 300 after the metal deposition processes. FIG. 3D shows, for example, a passivating oxide layer 320 formed on sidewalls SW of TSV 10 and on the back side of semiconductor substrate 110, a seed layer 330 (e.g., Ni) deposited in TSV 10 and the back side of semiconductor substrate 110, and a metal layer 340 (e.g., Al/Cu) deposited on the seed layer 330. Metal layer 340 may form a conductive material trace or line e.g., trace 346) on the sidewalls of the TSV that electrically connects the back side and the front side of semiconductor die 12 (i.e., connects the back side to metal contact pad 114C on the front side).

Assembly 300 may be further processed through additional wafer level processing steps for developing the redistribution layer on the back side of the silicon substrate before dicing or singulation of the silicon substrate into individual photosensitive modules. These additional wafer-level steps may, for example, include photolithography to form contact pads on the back side, attachment of lead frames, attachment of a ball grid array, and at least partial encapsulation of the optical sensor die in molding material, etc.

Figure 3E:
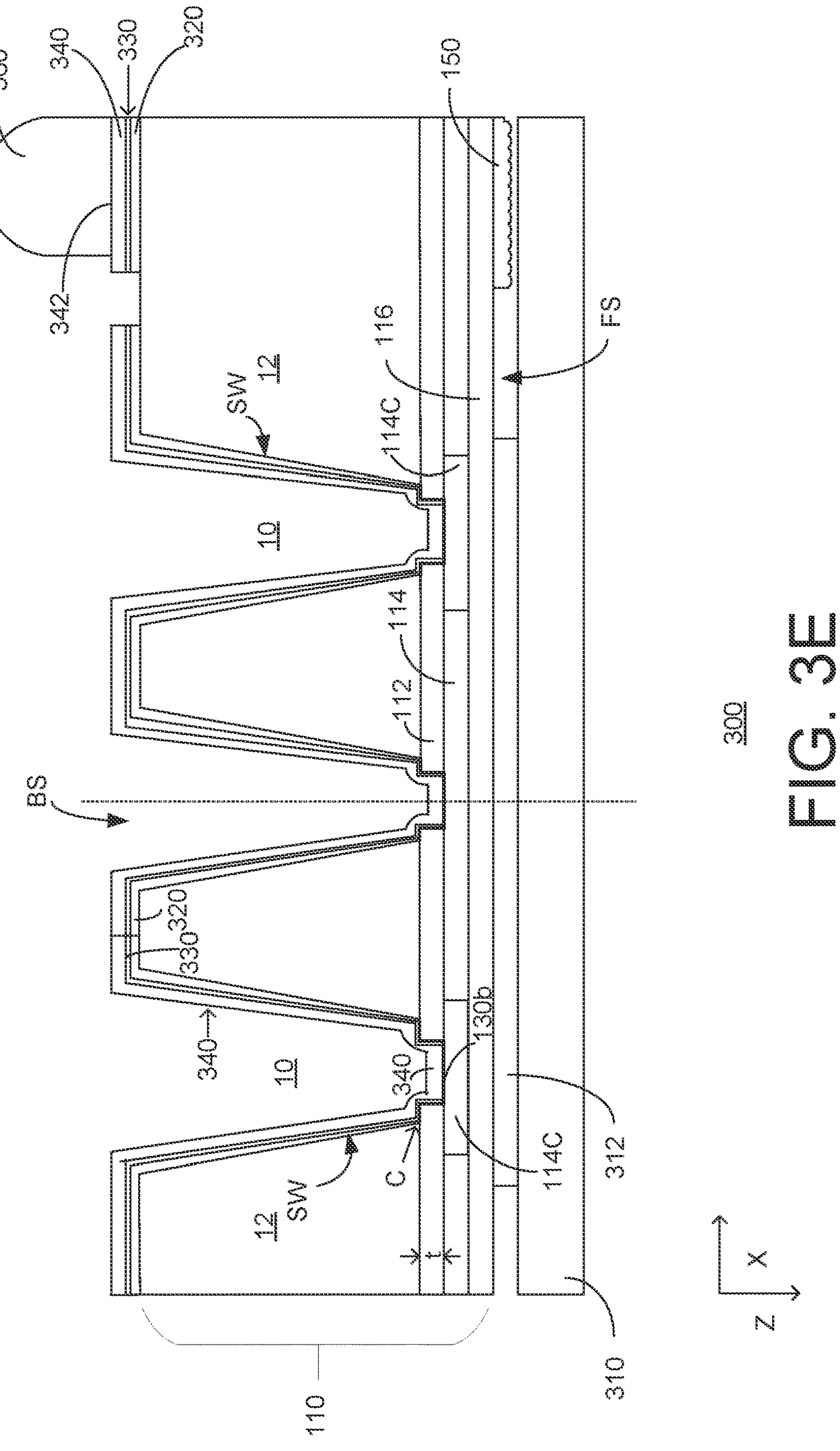

FIG. 3E shows for example, assembly 300 after some of these additional wafer level processing steps. FIG. 3E shows, for example, assembly 300 with a contact pad 342 formed on the back side of die 12, and a grid ball (e.g., a solder ball 360) disposed on contact pad 342 for a ball grid array package of semiconductor die 12.

Figure 4:
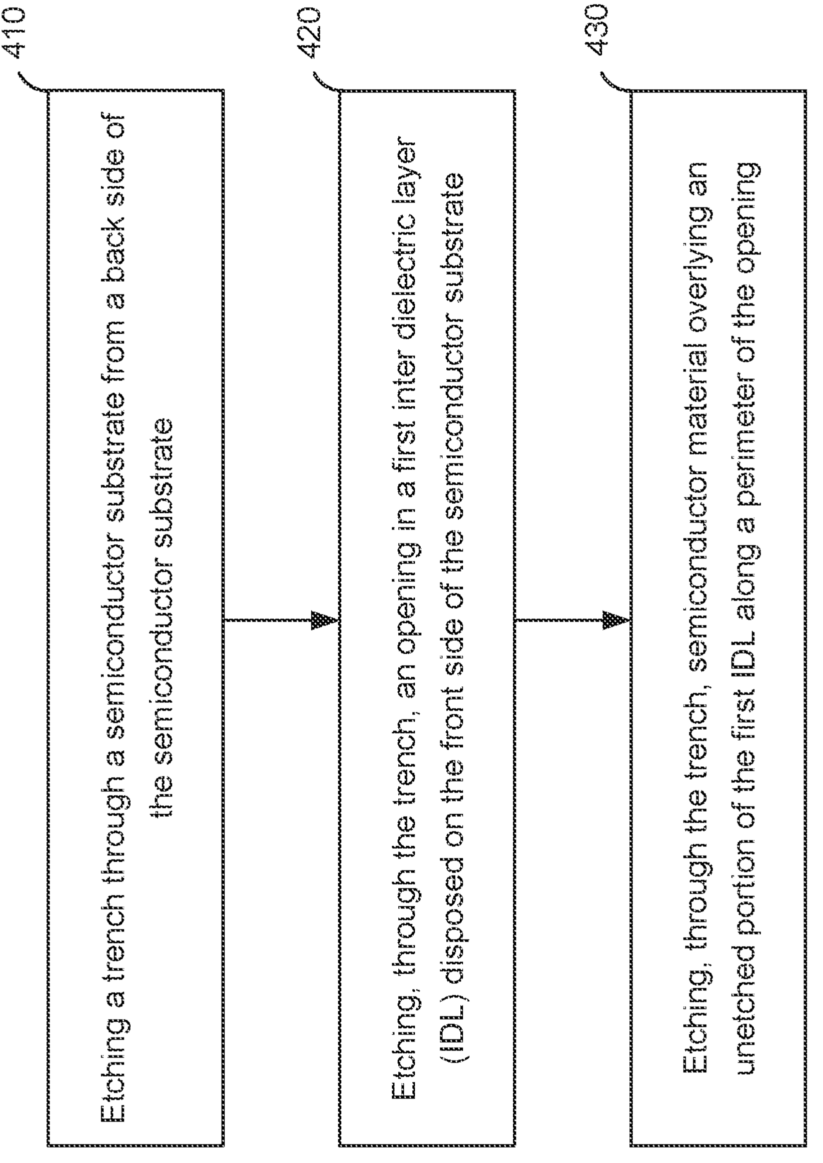
FIG. 4 illustrates an example method for making an electrical connection between a front side of the semiconductor substrate and the back side of the semiconductor substrate.

FIG. 4 shows an example method 400 for making an electrical connection between a front side of the semiconductor substrate and the back side of the semiconductor substrate.

Method 400 includes etching a trench through a semiconductor substrate from a back side of the semiconductor substrate (410). The trench extends from the back side of the semiconductor substrate to a front side of the semiconductor substrate.

Method 400 further includes etching, through the trench, an opening in a first inter dielectric layer (IDL) disposed on the front side of the semiconductor substrate (420). The opening exposes a portion of a contact pad that is included in a second IDL disposed over the first IDL. The exposed portion of the contact pad forms a central portion of a bottom surface of the trench.

Method 400 further includes etching, through the trench, semiconductor material overlying an unetched portion of the first IDL along a perimeter of the opening (430). The unetched portion of the first IDL (e.g., of length L in the x direction and height H in the z direction, FIG. 1) underlying the etched semiconductor material forms a raised portion of the bottom surface of the trench.

Method 400 can further include depositing a metal layer in the trench to form an electrical connection to the contact pad at the front side of the semiconductor substrate from the back side of the semiconductor substrate. The metal layer deposited in the trench includes a seed metal layer that can be patterned and etched to define a conductive material trace between the contact pad at the front side and the back side of the semiconductor substrate.

In example implementations, the metal layer includes, for example, at least one of nickel, aluminum, and copper.

It will be understood that, in the foregoing description, when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, top, bottom, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor device processing techniques associated with semiconductor substrates including, but not limited to, for example, silicon (Si), silicon carbide (SiC), gallium arsenide (GaAs), gallium nitride (GaN), and/or so forth.

While certain features of the described implementations have been illustrated as described herein, many modifications, substitutions, changes, and equivalents will now occur to those skilled in the art. For instance, features illustrated with respect to one implementation can, where appropriate, also be included in other implementations. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

The invention claimed is:

1. A semiconductor die, comprising:

a substrate including a semiconductor device;

a through-substrate via (TSV) extending from an opening at a back side of the substrate to an inter dielectric layer (IDL) on a front side of the substrate, the TSV having a stepped bottom surface at the front side of the substrate, the stepped bottom surface including a well portion defined by an opening in the IDL that exposes a metal contact pad, and a step portion extending outwardly from edges of the well portion, the step portion including a portion of the IDL;

a passivation layer disposed on a sidewall of the TSV including a sidewall of the well portion and on a back side of the substrate; and a metal layer deposited on the passivation layer and forming an electrical connection from the back side of the substrate to the metal contact pad.

2. The semiconductor die of claim 1, wherein a bottom surface of the well portion is at a larger depth than a depth of a surface of the step portion.

3. The semiconductor die of claim 1, wherein the metal contact pad is a metal contact pad including at least one of aluminum and copper.

4. The semiconductor die of claim 1, wherein the IDL is a first IDL disposed on a surface of the substrate, wherein the step portion includes an unetched portion of the first IDL, and wherein the metal contact pad is included in a second IDL disposed on a surface of the first IDL.

5. The semiconductor die of claim 1, wherein the metal layer includes a seed metal layer that is patterned and etched to define a conductive material trace between the metal contact pad at the front side and the back side of the semiconductor die.

6. The semiconductor die of claim 1, wherein the metal layer includes at least one of nickel, aluminum, and copper.

7. The semiconductor die of claim 1, further comprising an optically active surface area (OASA) disposed on the front side of the substrate.

8. The semiconductor die of claim 5, wherein the seed metal layer is a nickel layer.

9. The semiconductor die of claim 8, wherein the metal layer includes a layer of aluminum or copper deposited on the nickel layer.

10. A package, comprising:

an optical sensor die, the optical sensor die including an optically active surface area (OASA) disposed on a front side of a substrate;

a glass cover disposed above the OASA and attached to the front side the substrate by a dam material;

a through-substrate via (TSV) extending from an opening at a back side of the substrate to an inter dielectric layer (IDL) on a front side of the substrate, the TSV having a stepped bottom surface at the front side of the substrate, the stepped bottom surface including a well portion defined by an opening in the IDL that exposes a metal contact pad, and a step portion extending outwardly from edges of the well portion, the step portion including a portion of the IDL a passivation layer disposed on a sidewall of the TSV including a sidewall of the well portion and on a back side of the substrate; and a metal layer deposited on the passivation layer and forming an electrical connection from the back side of the substrate to the metal contact pad.

11. The package of claim 10, wherein a bottom surface of the well portion is at a larger depth than a depth of a top surface of the step portion.

12. The package of claim 10, wherein the metal contact pad is a metal contact pad including at least one of aluminum and copper.

13. The package of claim 10, wherein the IDL is a first IDL disposed on a surface of the substrate, wherein the step portion includes an unetched portion of the first IDL, and wherein the metal contact pad is included in a second IDL disposed on a surface of the first IDL.

14. The package of claim 10, wherein the metal layer includes a seed metal layer that is patterned and etched to define a conductive material trace between the metal contact pad at the front side and the back side of the substrate.

15. The package of claim 10, wherein the metal layer includes at least one of nickel, aluminum, and copper.

16. The package of claim 10 further comprising molding material that at least partially encapsulates the optical sensor die in the package.

17. The package of claim 14, wherein the seed metal layer is a nickel layer.

18. A method comprising:

etching a trench through a semiconductor substrate from a back side of the semiconductor substrate, the trench extending from the back side of the semiconductor substrate to a front side of the semiconductor substrate;

etching, through the trench, an opening in a first inter dielectric layer (IDL) disposed on the front side of the semiconductor substrate, the opening exposing a portion of a contact pad included in a second IDL disposed over the first IDL and forming a central portion of a bottom surface of the trench; and etching, through the trench, semiconductor material overlying an unetched portion of the first IDL along a perimeter of the opening to form a raised portion of the bottom surface of the trench.

19. The method of claim 18, further comprising depositing a metal layer in the trench to form an electrical connection to the contact pad at the front side of the semiconductor substrate from the back side of the semiconductor substrate.

20. The method of claim 19, wherein the metal layer deposited in the trench includes a seed metal layer that is patterned and etched to define a conductive material trace between the contact pad at the front side and the back side of the semiconductor substrate.

21. The method of claim 19, wherein the metal layer includes at least one of nickel, aluminum, and copper.

22. The method of claim 18, further comprising depositing a passivation layer along a sidewall of the trench and into the opening in the first IDL.

* * * * *